(12) United States Patent
Lin et al.

(10) Patent No.: US 7,750,450 B2
(45) Date of Patent: Jul. 6, 2010

(54) STACKED DIE PACKAGE WITH STUD SPACERS

(75) Inventors: Ying-Ren Lin, Kaohsiung (TW); Nelson Punzalan, Kaohsiung (TW); Chee Key Chung, Tainan (TW)

(73) Assignee: Intel Corporation, Santa Clara, CA (US)

( * ) Notice: Subject to any disclaimer, the term of this patent is extended or adjusted under 35 U.S.C. 154(b) by 536 days.

(21) Appl. No.: 11/642,295

(22) Filed: Dec. 20, 2006

(65) Prior Publication Data

US 2008/0150156 A1 Jun. 26, 2008

(51) Int. Cl.
*H01L 23/10* (2006.01)
(52) U.S. Cl. ...................................... 257/686
(58) Field of Classification Search ............... 257/685, 257/686, 694, 701, 723, 724, 737, 738, 777, 257/779, 780, 784; 438/108, 109, 118, 621–617
See application file for complete search history.

(56) References Cited

U.S. PATENT DOCUMENTS

| 6,527,163 | B1 * | 3/2003 | Eslampour | 228/180.1 |
| 6,731,011 | B2 * | 5/2004 | Verma et al. | 257/777 |
| 7,200,021 | B2 * | 4/2007 | Raghuram | 365/51 |
| 7,268,418 | B2 * | 9/2007 | Wang | 257/686 |
| 7,288,837 | B2 * | 10/2007 | Nojiri et al. | 257/686 |
| 7,629,695 | B2 * | 12/2009 | Yoshimura et al. | 257/777 |
| 2008/0037357 | A1 * | 2/2008 | Pelley et al. | 365/230.05 |

\* cited by examiner

*Primary Examiner*—Evan Pert
(74) *Attorney, Agent, or Firm*—Buckley, Maschoff & Talwalkar LLC

(57) ABSTRACT

A system may include a first integrated circuit die comprising a first upper surface, an integrated circuit package substrate comprising a second upper surface, a wire coupled to the a first upper surface and to the second upper surface, a plurality of elements coupled to the first upper surface, and a second integrated circuit die coupled to the plurality of elements. A portion of the wire is disposed between the first integrated circuit die and the second integrated circuit die.

11 Claims, 7 Drawing Sheets

STACKED DIE PACKAGE WITH STUD SPACERS

BACKGROUND

Conventional integrated circuit (IC) packages may include more than one IC die. Such systems may provide robust communication between the included IC dice, improved processing power per unit area and/or increased functionality per unit area. Many packaging systems exist for protecting multiple dice and for coupling the IC dice to each other and to various external elements.

Some systems provide multiple IC dice stacked onto a single IC package substrate. In one example, a first IC die is conventionally mounted and electrically coupled to an IC package substrate, a silicon spacer is attached to a central area of the IC die, and a second IC die is adhered to the silicon spacer. Preparation and attachment of the silicon spacer therefore requires additional processing that may be undesirable in some scenarios.

DETAILED DESCRIPTION

Figure 1:
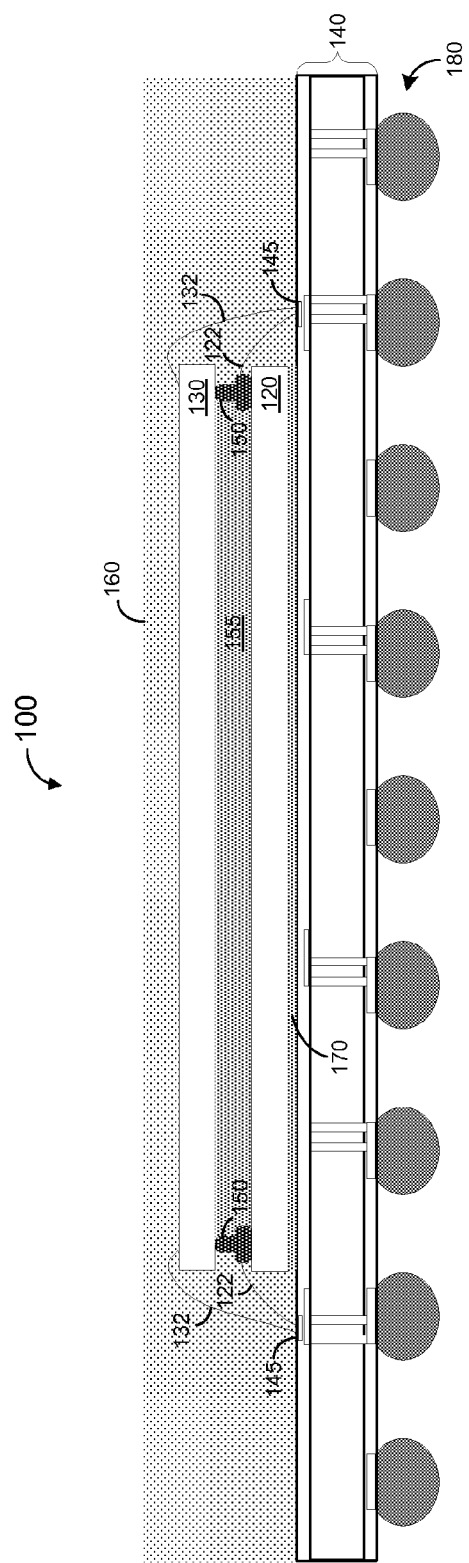
FIG. 1 is a side cross-sectional view of an apparatus according to some embodiments.

FIG. 1 is a cross-sectional side view of apparatus 100 according to some embodiments. Apparatus 100 includes first IC die 120 and second IC die 130. According to some embodiments, IC dice 120 and 130 include integrated electrical devices for providing desired functionality and may be fabricated using any suitable materials and fabrication techniques.

Wires 122 are coupled to an upper surface of IC die 120 and to an upper surface of IC package substrate 140. As will be described with respect to FIG. 2, wires 122 may be coupled to conductive contacts on the upper surfaces of IC die 120 (not shown) and conductive contacts 145 of IC package substrate 140. Such coupling may allow wires 122 to pass electrical signals between elements of IC die 120 and IC package substrate 140. As shown, at least a portion of wires 122 is disposed between IC die 120 and IC die 130.

Elements 150 are coupled to the upper surface of IC die 120. In some embodiments, a distance between an uppermost portion of elements 150 and the upper surface of IC die 120 is greater than a distance between an uppermost portion of wires 122 and the upper surface of IC die 120. Elements 150 may comprise any material and/or shape according to some embodiments. For example, each of elements 150 may comprise a wire bond stud.

IC die 130 is coupled to elements 150. Die attach material 155 is disposed between IC die 120 and IC die 130 and may be disposed between elements 150 and IC die 130 in some embodiments. Die attach material 155 may comprise any type of epoxy, adhesive, or other material for securing IC dice that is or becomes known.

Wires 132 are coupled to an upper surface of IC die 130 and to the upper surface of IC package substrate 140. Wires 132 may be coupled to conductive contacts on the upper surfaces of IC package substrate 140 that are different from conductive contacts 145 to which wires 122 are coupled, but embodiments are not limited thereto. Accordingly, wires 132 may pass electrical signals between elements of IC die 130 and IC package substrate 140. Mold compound 160 is disposed on and around IC die 130, wires 132, elements 150, IC die 120, wires 122 and IC package substrate 140 to provide protection thereto.

IC package substrate 140 is attached to IC die 120 using die attach material 170. IC package substrate 140 may include a base dielectric layer with conductive layers fabricated thereon and separated by additional dielectric layers. The dielectric layers may be composed of any suitable material, including but not limited to bismaleimide triazine (BT) and FR4 in some embodiments. The conductive layers may comprise reference planes for supplying reference voltages to electrical components that are connected to IC package substrate 140, or routing layers including conductive traces for carrying electrical signals between such electrical components.

Solder balls 180 may be coupled to a substrate such as a motherboard to carry power and other electrical signals between elements of apparatus 100 and external devices. Solder balls 180 may be mountable directly to a motherboard (not shown) or onto an interposer that is in turn mounted directly to a motherboard. Alternative interconnects such as through-hole pins may be used instead of solder balls 180 to mount apparatus 100 to a motherboard, a socket, or another substrate.

Figure 2:
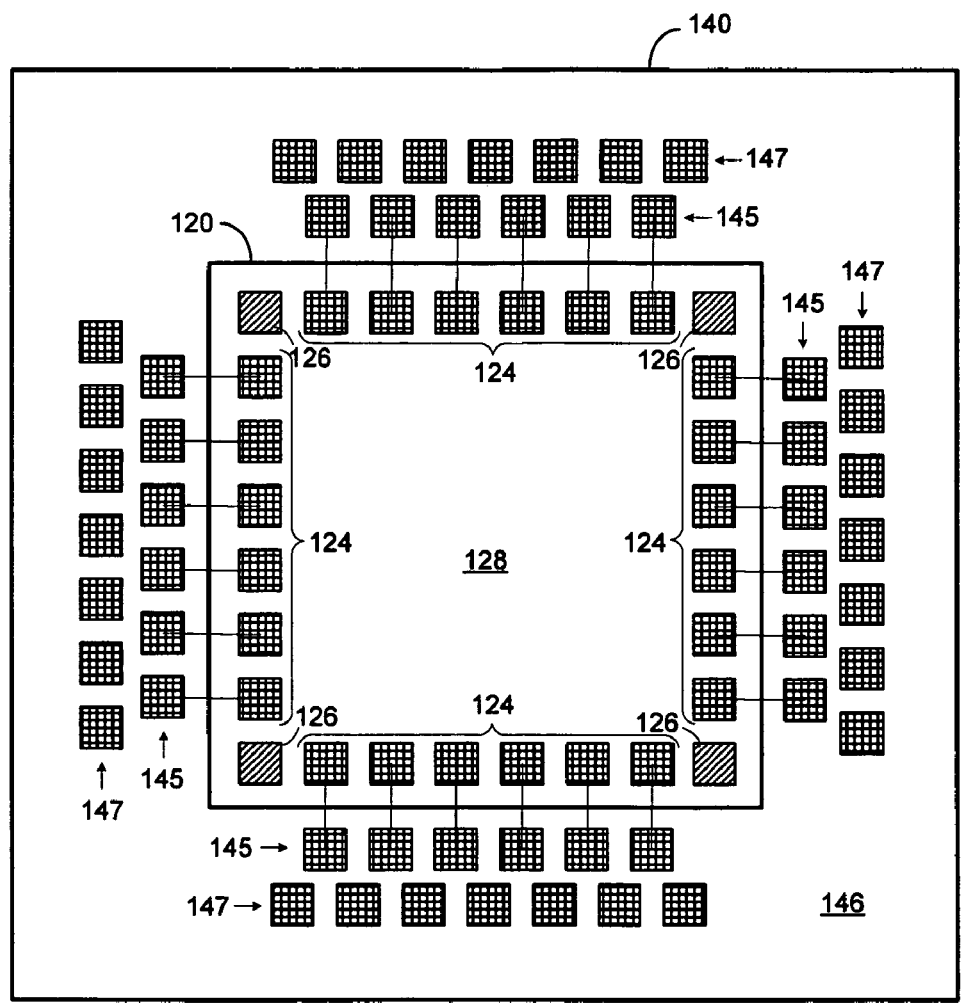
FIG. 2 is a top view of an upper surface of an integrated circuit die and an upper surface of an integrated circuit package according to some embodiments.

A perspective top view of IC die 120 and IC package substrate 140 according to some embodiments is shown in FIG. 2. Mold compound 160, IC die 130, wires 132, material 155, elements 150 and wires 122 have been removed for clarity. The contacts, wires, substrate and IC die of FIG. 2 are not necessarily drawn to scale with respect to one another, and embodiments may employ many more contacts and wires than illustrated therein.

FIG. 2 shows electrically-conductive contacts 124 and 126 on upper surface 128 of IC die 120, wires 122, and electrically-conductive contacts 145 of upper surface 146 to which wires 122 are coupled. Electrically-conductive contacts 147 are to receive wires 132 according to some embodiments. Each illustrated electrically-conductive contact may comprise gold and/or nickel-plated copper and may be recessed under, flush with, or extending above respective surfaces 128 or 146.

Electrically-conductive contacts 124 may be electrically connected to electrical device integrated in IC die 120. Contacts 126 are to receive elements 150 as will be described below. According to some embodiments, contacts 126 are not electrically connected to electrical device integrated in IC die 120. In this regard, contacts 126 need not necessarily be electrically conductive. Although FIG. 2 shows contacts having substantially square cross section, contacts of other embodiments have cross sections of different and/or varying shapes.

Figure 3:
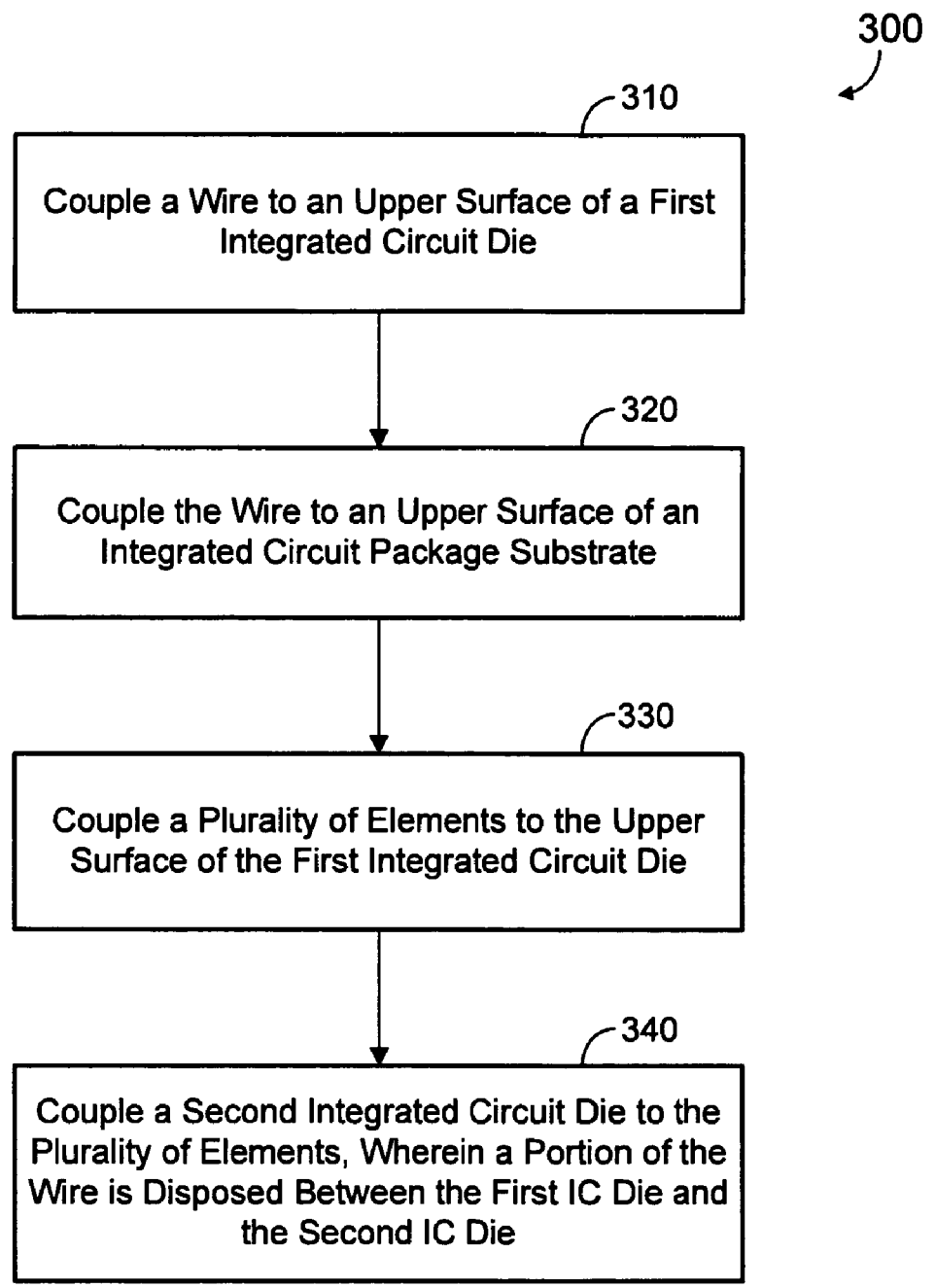
FIG. 3 is a diagram of a process to fabricate the FIG. 1 apparatus according to some embodiments.

FIG. 3 is a diagram of process 300 to fabricate an apparatus according to some embodiments. Process 300 may be executed by one or more devices, and all or a part of process 300 may be executed manually. Process 300 may be executed by an entity different from an entity that manufactures any IC die used therein.

Initially, at 310, a wire is coupled to an upper surface of a first IC die. According to some embodiments of 310, the wire is bonded to a conductive electrical contact disposed at the upper surface of the IC die using conventional wire bonding techniques.

Figure 4A:
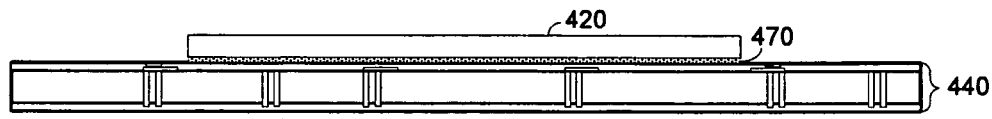
FIGS. 4A through 4F illustrate fabrication of an apparatus according to some embodiments.

FIG. 4A is a cross-sectional side view of IC die 420 that may be used in some embodiments of process 300. IC die 420 may include any circuitry and may be fabricated prior to 310 in any manner that is or becomes known. IC die 420 is coupled to IC package substrate 440 by die attach material 470. Die attach material 470 may comprise a film, paste, epoxy and/or gel that may be cured to a hardened state sometime after IC die 420 is placed thereon. Construction of the FIG. 4A device may proceed using any suitable system.

Figure 4B:
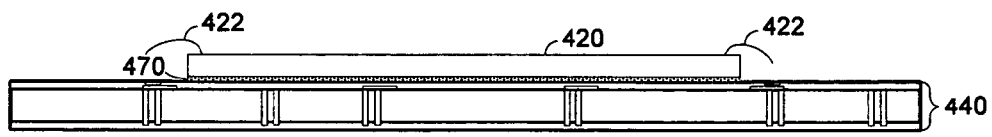
Figure 4C:
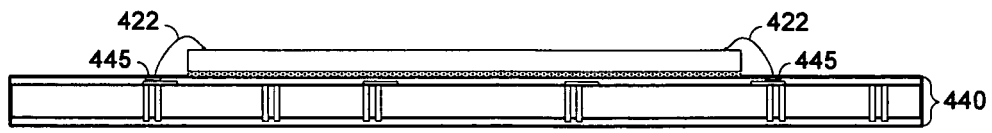

FIG. 4B illustrate wires 422 coupled to the upper surface of IC die 420 according to some embodiments of 310. Wires 422 may comprise any material or thickness suitable for IC wire bonding. Next, at 320, the wire of 310 is coupled to an upper surface of an IC package substrate. In this regard, FIG. 4C illustrates wires 422 coupled to an upper surface of IC package substrate 420. Wires 422 are shown coupled to electrical contacts 445 located at an upper surface of substrate 420.

According to some embodiments, the wire is coupled to the upper surface of the IC package before the wire is coupled to the upper surface of the IC die. Moreover, first ends of two or more wires may be coupled to one of the IC package or the IC die before the second ends of the two or more wires are coupled to the other of the IC package or IC die.

Figure 4D:
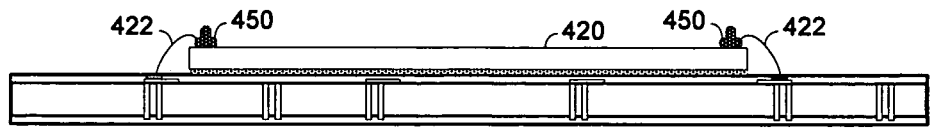

A plurality of elements is coupled to the upper surface of the first IC die at 330. FIG. 4D shows IC die 420 with elements 450 coupled thereto. As shown in FIG. 2, elements 450 may be disposed adjacent to a location on the upper surface to which wires 422 and coupled. Any number of elements 450 may be coupled at 330 to any location of IC die 420.

Figure 5A:
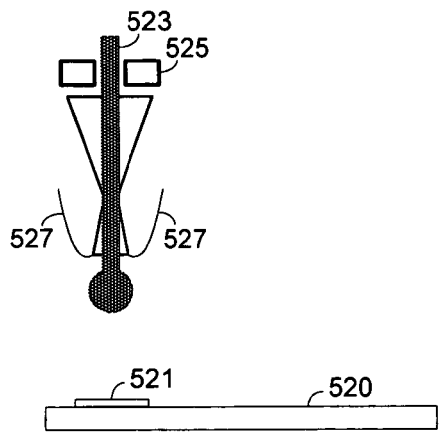
FIGS. 5A through 5D illustrate fabrication of a wire bond stud according to some embodiments.

FIGS. 5A through 5D illustrate coupling of an element to an IC die according to some embodiments. The process shown in FIGS. 5A through 5D may be similar to stud formation conventionally used in reverse wire bonding (i.e., bonding wire to IC substrate and then to stud previously-formed on IC die). Specifically, FIG. 5A shows an upper surface of IC die 520 including bonding pad 521. A ball bond of wire 523 is positioned above pad 521 and clamp 525 is open around wire 523. Capillaries 527 extend from wire 523, which may be composed of any suitable material including but not limited to Au or Cu.

Figure 5B:
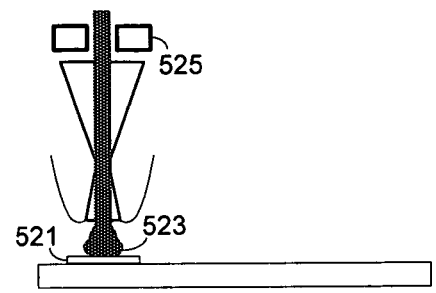
Figure 5C:
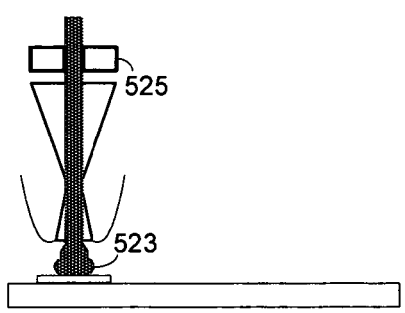
Figure 5D:
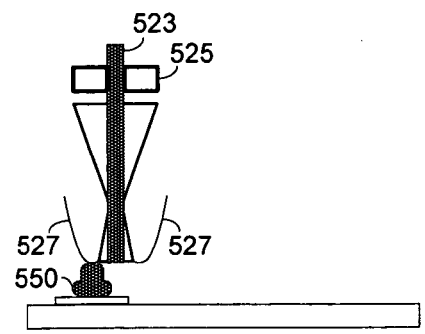

Wire 523 is then placed onto pad 521 as shown in FIG. 5B. Clamp 525 closes around wire 523 and applies energy (e.g., heat, ultrasonic vibration) thereto as shown in FIG. 5C. The energy causes wire 523 to reflow, at which point a portion of wire 523 is sheared and flattened by capillaries 527. FIG. 5D shows capillaries 527 performing the above-described function according to some embodiments.

Figure 4E:
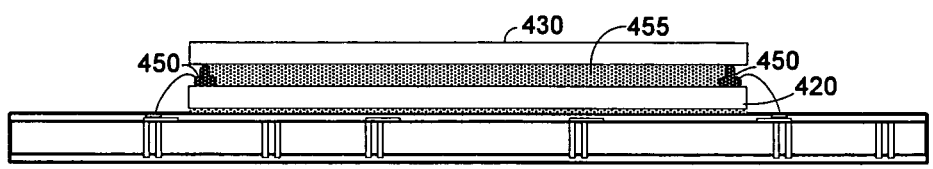
Figure 4F:
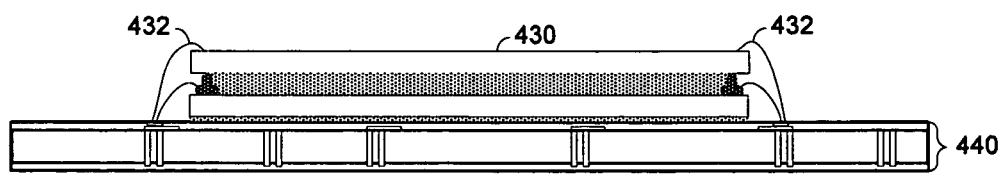

Returning to process 300, a second IC die is coupled to the plurality of elements at 340. As shown in FIG. 4E, die attach material 455 (e.g., a low-modulus paste of film) may be placed on IC die 420 and/or on elements 450 in order to couple IC die 430 to elements 450 at 340. FIG. 4F shows a further step according to some embodiments in which wires 432 are coupled to an upper surface of IC die 430 and to the upper surface of IC package substrate 420. Additional processes may then be employed to deposit mold compound on the FIG. 4F device as shown in FIG. 1.

Figure 6:
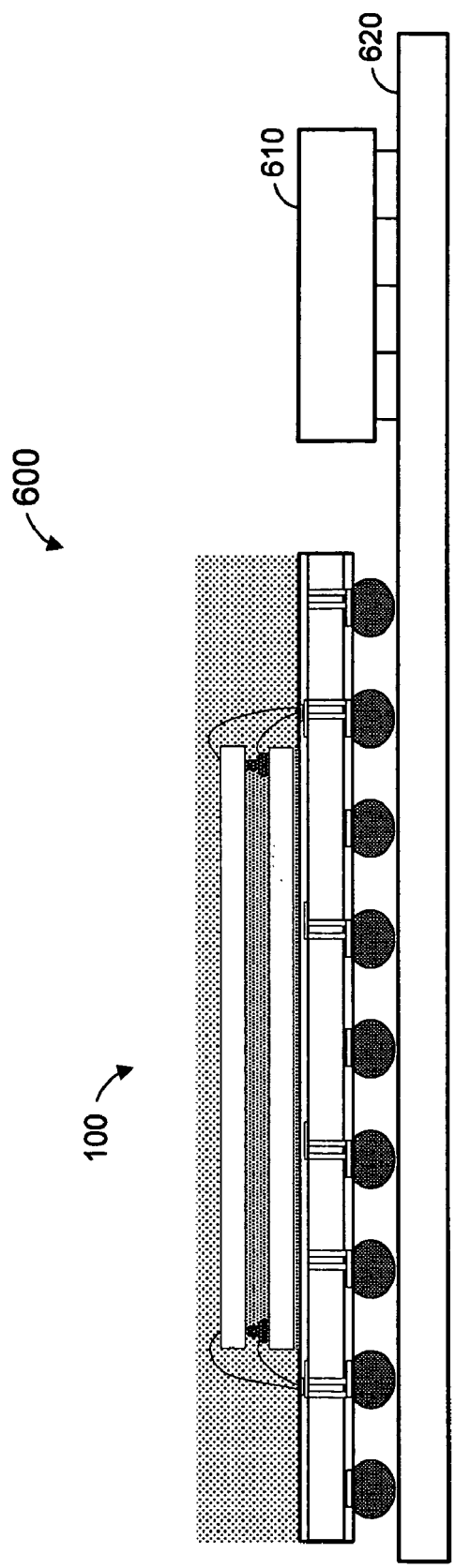
FIG. 6 is a diagram of a system according to some embodiments.

FIG. 6 is a cross-sectional side view of system 600 according to some embodiments. System 600 may comprise components of a server platform. System 600 includes apparatus 100 as described above, memory 610 and motherboard 620. Apparatus 100 may comprise a microprocessor die and a chipset die.

Motherboard 620 may electrically couple memory 610 to apparatus 100. More particularly, motherboard 620 may comprise a bus (not shown) that is electrically coupled to apparatus 100 and to memory 610. Memory 610 may store, for example, applications, programs, procedures, and/or modules that store instructions to be executed by the microprocessor die of apparatus 100. Memory 610 may comprise, according to some embodiments, any type of memory for storing data, such as a Single Data Rate Random Access Memory (SDR-RAM), a Double Data Rate Random Access Memory (DDR-RAM), or a Programmable Read Only Memory (PROM).

The several embodiments described herein are solely for the purpose of illustration. The various features described herein need not all be used together, and any one or more of those features may be incorporated in a single embodiment. Some embodiments may include any currently or hereafter-known versions of the elements described herein. Therefore, other embodiments may be practiced with various modifications and alterations.

What is claimed is:

1. An apparatus comprising:
   a first integrated circuit die comprising a first upper surface;
   a second integrated circuit die comprising a first lower surface;
   an integrated circuit package substrate comprising a second upper surface;
   a wire coupled to the first upper surface and to the second upper surface; and
   a plurality of elements, each of the plurality of elements being coupled to the first upper surface and to the first lower surface,
   wherein a portion of the wire is disposed between the first integrated circuit die and the second integrated circuit die.

2. An apparatus according to claim 1, wherein a distance between an uppermost portion of each of the plurality of elements and the first upper surface is greater than a distance between an uppermost portion of the wire and the first upper surface.

3. An apparatus according to claim 1, wherein each of the plurality of elements comprises a wire bond stud, each wire bond stud comprising a first portion that is coupled to the first upper surface and a second portion that is coupled to the first lower surface, wherein the first portion is substantially cylindrical shaped and comprising a first radius, wherein the second portion is substantially cylindrical shaped and comprising a second radius, and wherein the second radius is greater than the first radius.

4. An apparatus according to claim 3, further comprising:
   a first electrically-conductive contact on the first upper surface and electrically connected to electrical devices integrated in the first integrated circuit die; and
   a second electrically-conductive contact on the first upper surface and not electrically connected to electrical devices integrated in the first integrated circuit die,
   wherein the wire is coupled to the first electrically-conductive contact, and
   wherein the wire bond stud is coupled to the second electrically-conductive contact.

5. An apparatus according to claim 1, further comprising:
a second wire coupled to the first upper surface and to the second upper surface,
wherein the plurality of elements are coupled adjacent to each corner of the first integrated circuit die.

6. An apparatus according to claim 1, further comprising:
die attach material deposited on the first upper surface,
wherein the second integrated circuit die is coupled to the die attach material.

7. A system comprising:
a first integrated circuit die comprising a first upper surface;
a microprocessor die integrated circuit die comprising a first lower surface;
an integrated circuit package substrate comprising a second upper surface;
a wire coupled to the first upper surface and to the second upper surface;
a plurality of elements, each of the plurality of elements being coupled to the first upper surface and to the first lower surface,
a motherboard connected to the integrated circuit package substrate; and
a double data rate memory connected to the motherboard,
wherein a portion of the wire is disposed between the first integrated circuit die and the microprocessor die.

8. A system according to claim 7, wherein a distance between an uppermost portion of each of the plurality of elements and the first upper surface is greater than a distance between an uppermost portion of the wire and the first upper surface.

9. A system according to claim 7, wherein each of the plurality of elements comprises a wire bond stud, and wherein each wire bond stud comprises a first portion that is coupled to the first upper surface and a second portion that is coupled to the first lower surface, wherein the first portion is substantially cylindrical shaped and comprising a first radius, wherein the second portion is substantially cylindrical shaped and comprising a second radius, and wherein the second radius is greater than the first radius, and further comprising:
a first electrically-conductive contact on the first upper surface and electrically connected to electrical devices integrated in the first integrated circuit die; and
a second electrically-conductive contact on the first upper surface and not electrically connected to electrical devices integrated in the first integrated circuit die,
wherein the wire is coupled to the first electrically-conductive contact, and
wherein the wire bond stud is coupled to the second electrically-conductive contact.

10. A system according to claim 7, further comprising:
die attach material deposited on the first upper surface,
wherein the microprocessor die is coupled to the die attach material.

11. The system according to claim 7, wherein the first integrated circuit die is a same size as the second integrated circuit die.

* * * * *